(12) United States Patent
Cheng et al.

(10) Patent No.: US 6,924,503 B2
(45) Date of Patent: Aug. 2, 2005

(54) ORGANIC INTEGRATED DEVICE FOR THIN FILM TRANSISTOR AND LIGHT EMITTING DIODE AND PROCESS FOR FABRICATING THE SAME

(75) Inventors: Horng-Long Cheng, Hsinchu (TW); Yu-Wu Wang, Taichung (TW); Ching-Hsun Chao, Kaohsiung (TW); Cheng-Chung Lee, Hsinchu (TW); Chai-Yuan Sheu, Tainan (TW)

(73) Assignee: Industrial Technology Research Institute, Hsinchu (TW)

(*) Notice: Subject to any disclaimer, the term of this patent is extended or adjusted under 35 U.S.C. 154(b) by 36 days.

(21) Appl. No.: 10/340,710

(22) Filed: Jan. 13, 2003

(65) Prior Publication Data
US 2004/0041146 A1 Mar. 4, 2004

(30) Foreign Application Priority Data
Aug. 28, 2002 (TW) ........................................ 09111950 A (51) Int. Cl.[7] ........................ H01L 35/24; H01L 51/00

(52) U.S. Cl. ................... 257/40; 257/290; 257/E51.022
(58) Field of Search .................... 257/40, 290, E51.022

(56) References Cited

U.S. PATENT DOCUMENTS 6,437,422 B1 * 8/2002 Solomon et al. ............ 257/618
6,603,139 B1 * 8/2003 Tessler et al. ................ 257/40

* cited by examiner

Primary Examiner—David Nelms
Assistant Examiner—Tu-Tu Ho
(74) Attorney, Agent, or Firm—Birch, Stewart, Kolasch & Birch, LLP (57) ABSTRACT

An organic integrated device for thin film transistor and light emitting diode. The organic integrated device of the present invention includes a top-gate organic thin film transistor (top-gate OTFT) and an organic light emitting diode (OLED), both formed on the same substrate. In the organic integrated device, some layers can be commonly used by both OTFT and OLED, and some layers can be made of the same material and formed in the same course, which simplifies the entire process.

16 Claims, 8 Drawing Sheets

FIG. 4c

ORGANIC INTEGRATED DEVICE FOR THIN FILM TRANSISTOR AND LIGHT EMITTING DIODE AND PROCESS FOR FABRICATING THE SAME

This nonprovisional application claims priority under 35 U.S.C. §119(a) on Patent Application No. 091119507 filed in TAIWAN on Aug. 8, 2002, which is herein incorporated by reference.

BACKGROUND OF THE INVENTION

1. Field of the Invention

The present invention relates to an organic integrated device for thin film transistor and light emitting diode, and more particularly to an organic integrated device including top-gate thin film transistor and light emitting diode.

2. Description of the Prior Art

Organic light emitting diode (OLED) is a LED that uses an organic layer as the active layer. In recent years, OLED has been gradually applied in flat panel displays and has many advantages, such as operating at low voltage, high brightness, light weight and slim, full viewing angle, and high effective contrast ratio.

Organic thin film transistor (OTFT) is a TFT that uses an organic layer to serve as the active layer and has been used to drive OLED. In recent years, in order to simplify the process and decrease the production cost, some researchers have developed integration technology that fabricates OLED and OTFT monolithically (i.e., on the same substrate).

For example, Sirringhaus et al. in University of Cambridge disclose an integrated device of OLED and bottom-gate OTFT, which uses MEH-PPV [poly[2-methoxy-5-(2'-ethyl-hexyloxy)-p-phenylene-vinylene]] as the light emitting layer of OLED. Since the OLED irradiates through an opaque metal electrode, the light efficiency is poor. Also, the production process is complicated (Science, Vol. 280, p.1741).

Choi et al. in U.S. Pat. No. 5,970,318 disclose another integrated device of OLED and bottom-gate OTFT. In the OTFT, the organic semiconducting layer is organic charge transfer complex or thiophene polymer, and the dielectric layer is also organic material. However, it is very difficult to pattern such organic material, making the OTFT fabrication difficult.

Nagami in U.S. Pat. No. 6,037,718 discloses an integrated device of an OLED and an npn-type transistor stacked on the OLED to drive the OLED. However, many layers of organic material are stacked, which makes the process complicated.

Bao et al. in U.S. Pat. No. 6,150,668 disclose another integrated device of OLED and bottom-gate OTFT. An organic semiconducting material is used as both the semiconducting layer of the OTFT and the hole transport layer of the OLED. However, after the organic semiconducting material is deposited, there is a need to form an additional protection layer in order to increase device reliability. In addition, since the organic semiconducting layer is not patterned, it is probable that current leakage or crosstalk between pixel and pixel occurs, making it difficult to meet the circuit design requirements.

SUMMARY OF THE INVENTION

An object of the present invention is to solve the above-mentioned problems and provide an organic integrated device for thin film transistor and light emitting diode and provide a process for fabricating the organic integrated device. The present invention also provides an organic integrated device display that includes the organic integrated device for thin film transistor and light emitting diode. The present invention integrates a top-gate OTFT and an OLED for the first time. Some layers can be commonly used by both the top-gate OTFT and OLED, and some layers can be made of the same material and formed in the same course, which simplifies the process.

To achieve the above objects, according to a first aspect of the present invention, the organic integrated device for thin film transistor and light emitting diode includes a substrate; a top-gate organic thin film transistor (OTFT) on the substrate; and an organic light emitting diode (OLED) on the substrate. The top-gate OTFT can be used to drive the OLED.

According to a second aspect of the present invention, in the above-mentioned integrated device of the present invention, the top-gate OTFT includes a gate, a dielectric, a source, a drain, and an organic active layer between the source and drain, the OLED includes an anode, a cathode, and a light emitting layer between the anode and cathode, and the source or drain of the OTFT are the same layer as the anode or cathode of the OLED.

According to a third aspect of the present invention, in the above-mentioned integrated device of the present invention, the top-gate OTFT includes a gate, a dielectric, a source, a drain, and an organic active layer between the source and drain, the OLED includes an anode, a cathode, and a light emitting layer between the anode and cathode, and the gate of the OTFT and the anode or cathode of the OLED are made of the same material and are formed in the same course.

According to a fourth aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer constitutes a source and drain of the top-gate OTFT and an anode of the OLED;

an organic semiconducting layer formed in the first opening and serving as an organic active layer of the top-gate OTFT;

a hole transport layer formed on the first conducting layer in the OLED region;

a light emitting layer formed on the hole transport layer;

an electron transport layer formed on the light emitting layer;

a dielectric layer formed in the OTFT region to cover the organic semiconducting layer, source, and drain;

a second conducting layer patterned and divided into a gate on the dielectric layer in the OTFT region and a cathode on the electron transport layer in the OLED region.

According to a fifth aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer constitutes a source and drain of the top-gate OTFT and an anode of the OLED;

an organic semiconducting layer formed in the first opening and serving as an organic active layer of the top-gate OTFT;

a hole transport layer formed on the first conducting layer in the OLED region;

a light emitting layer formed on the hole transport layer;

an electron transport layer formed on the light emitting layer;

a cathode formed on the electron transport layer;

a dielectric layer formed in both the OTFT region and OLED region to cover the source, drain, organic semiconducting layer, and cathode; and a gate formed on the dielectric layer in the OTFT region.

According to a sixth aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer constitutes a source and drain of the top-gate OTFT and an anode of the OLED;

an organic semiconducting layer formed in the first opening and on the anode of OLED, which serves as an organic active layer of the top-gate OTFT and as a hole transport layer of the OLED;

a light emitting layer formed on the hole transport layer in the OLED region;

an electron transport layer formed on the light emitting layer;

a dielectric layer formed in the OTFT region to cover the organic semiconducting layer, source, and drain; and a second conducting layer patterned and divided into a gate on the dielectric layer in the OTFT region and a cathode on the electron transport layer in the OLED region.

According to a seventh aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer serves as a source and drain of the top-gate OTFT and an anode of the OLED;

an organic semiconducting layer formed in the first opening and on the anode in the OLED region, which serves as an organic active layer of the top-gate OTFT and as a hole transport layer of the OLED;

a light emitting layer formed on the hole transport layer in the OLED region;

an electron transport layer formed on the light emitting layer;

a cathode formed on the electron transport layer;

a dielectric layer formed in both the OTFT region and OLED region to cover the source, drain, organic semiconducting layer, and cathode; and a gate formed on the dielectric layer in the OTFT region.

According to an eighth aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer constitutes a source and drain of the top-gate OTFT and an anode of the OLED;

a hole transport layer formed in the first opening and on the first conducting layer in the OLED region;

an organic semiconducting layer formed on the hole transport layer to serve as an organic active layer of the top-gate OTFT;

a light emitting layer formed on the organic semiconducting layer in the OLED region;

an electron transport layer formed on the light emitting layer;

a dielectric layer formed in the OTFT region to cover the organic semiconducting layer, source and drain; and a second conducting layer patterned and divided into a gate on the dielectric layer in the OTFT region and a cathode on the electron transport layer in the OLED region.

According to a ninth aspect of the present invention, the integrated device for thin film transistor and light emitting diode of the present invention includes:

a substrate having an OTFT region and an OLED region;

a first conducting layer formed on the substrate and having a first opening in the OTFT region to expose the substrate, wherein the first conducting layer serves as a source and drain of the top-gate OTFT and an anode of the OLED;

a hole transport layer formed in the first opening and on the first conducting layer in the OLED region;

an organic semiconducting layer formed on the hole transport layer to serve as an organic active layer of the top-gate OTFT;

a light emitting layer formed on the organic semiconducting layer in the OLED region;

an electron transport layer formed on the light emitting layer;

a cathode formed on the electron transport layer;

a dielectric layer formed in both the OTFT region and OLED region to cover the source, drain, organic semiconducting layer, and cathode; and a gate formed on the dielectric layer in the OTFT region.

According to a tenth aspect of the present invention, the process for fabricating an organic integrated device for thin film transistor and light emitting diode further comprises. First, a substrate including an OTFT region and an OLED region is provided. Next, a first conducting layer is formed on the substrate. A first opening is formed in the first conducting layer in the OTFT region to expose the substrate, such that the first conducting layer constitutes a source and drain of a top-gate OTFT and an anode of an OLED. Next, an organic semiconducting layer is formed to fill in the first opening and serve as an organic active layer of the top-gate OTFT. Next, a dielectric layer and a gate are formed in the OTFT region. Finally, a hole transport layer, light emitting layer, electron transport layer, and cathode are formed in the OLED region.

According to an eleventh aspect of the present invention, the process for fabricating an organic integrated device for thin film transistor and light emitting diode further comprises. First, a substrate including an OTFT region and an OLED region is provided. Next, a first conducting layer is formed on the substrate. A first opening is formed in the first conducting layer in the OTFT region to expose the substrate, such that the first conducting layer constitutes a source and drain of a top-gate OTFT and an anode of an OLED. Next, an organic semiconducting layer is formed on the first conducting layer to fill in the first opening and serve as an organic active layer of the top-gate OTFT and a hole transport layer of the OLED. Next, a dielectric layer and a gate are formed in the OTFT region. Finally, a light emitting layer, electron transport layer, and a cathode are formed in the OLED region.

According to a twelfth aspect of the present invention, the process for fabricating an organic integrated device for thin film transistor and light emitting diode further comprises. First, a substrate including an OTFT region and an OLED region is provided. Next, a first conducting layer is formed on the substrate. A first opening is formed in the first conducting layer in the OTFT region to expose the substrate, such that the first conducting layer constitutes a source and drain of a top-gate OTFT and an anode of an OLED. Next, a hole transport layer is formed on the first conducting layer in both OTFT and OLED regions to fill in the first opening. Next, an organic semiconducting layer is formed on the hole transport layer. Next, a dielectric layer and a gate are formed in the OTFT region. Finally, a light emitting layer, an electron transport layer, and a cathode are formed in the OLED region.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 1a to 1e are cross-sections illustrating the process flow of forming an organic integrated device for thin film transistor (TFT) and light emitting diode (LED) according to a first preferred embodiment of the present invention.

Figure 1A:
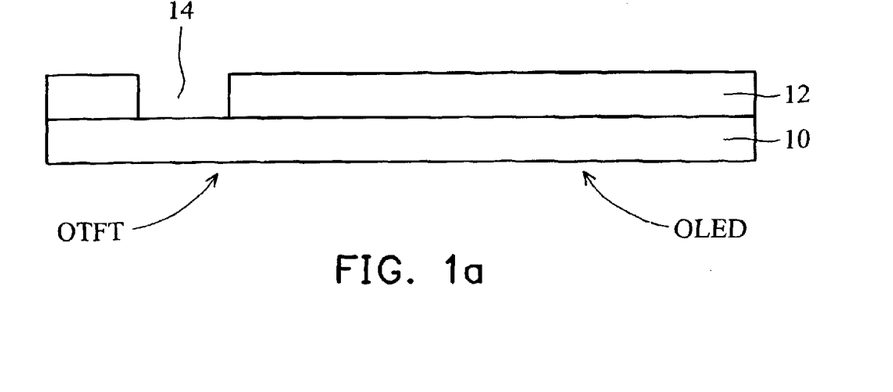
FIGS. 1a to 1e are cross-sections illustrating the process flow of forming an organic integrated device for thin film transistor and light emitting diode according to a first preferred embodiment of the present invention.

Referring to FIG. 1a, a substrate 10 including an OTFT region and OLED region is provided. Suitable substrate can be a silicon wafer, glass, quartz, a plastic substrate, or a flexible substrate. A first conducting layer 12 is formed on the substrate 10. Next, in the OTFT region, a first opening 14 is formed in the first conducting layer to expose the substrate 10. In this way, the first conducting layer 12 constitutes a source and drain of a top-gate OTFT to be formed in the future and an anode of an OLED to be formed in the future. The first conducting layer 12 can be metal, conducting polymer, or any conducting material. Suitable material for the anode of OLED can be one that injects electric holes into the organic semiconductor, such as indium tin oxide (ITO) or zinc oxide.

Figure 1B:
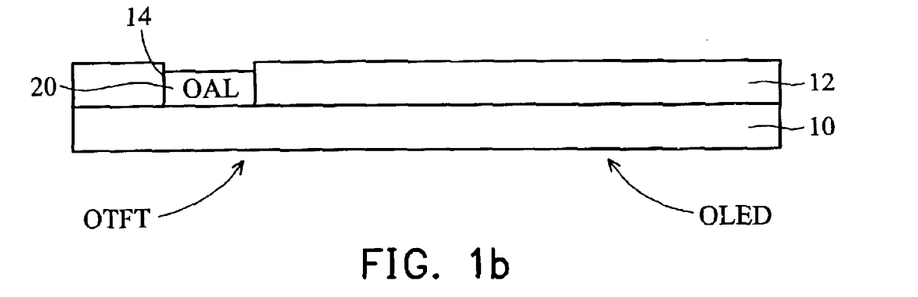

Subsequently, referring to FIG. 1b, an organic semiconducting layer 20 is filled into the first opening 14, serving as an organic active layer (OAL) of the top-gate OTFT. The organic semiconducting layer 20 can be small molecule material, polymer, or organometallic complex.

Figure 1C:
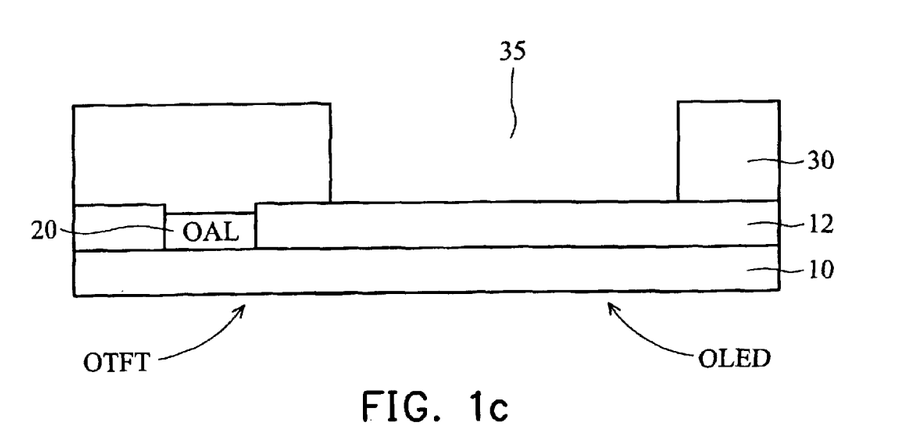

Subsequently, referring to FIG. 1c, a dielectric layer 30 is formed on the substrate 10 and a second opening 35 is formed in the dielectric layer 30 in the OLED region. The dielectric layer 30 can be inorganic material, organic material, or other high k material (k>3) such as ferroelectric material.

Figure 1D:
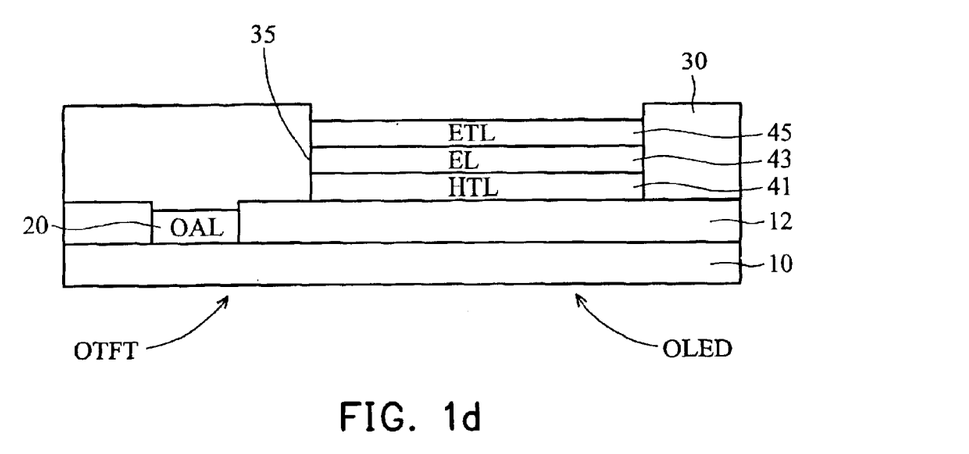

Subsequently, referring to FIG. 1d, a hole transport layer (HTL) 41, light emitting layer (EL) 43, and electron transport layer (ETL) 45 are successively formed and filled into the second opening 35. The hole transport layer 41 and electron transport layer 45 can be organic or inorganic material. The light emitting layer 43 can be organic semiconducting material, such as small molecule material, polymer, or organometallic complex.

Figure 1E:
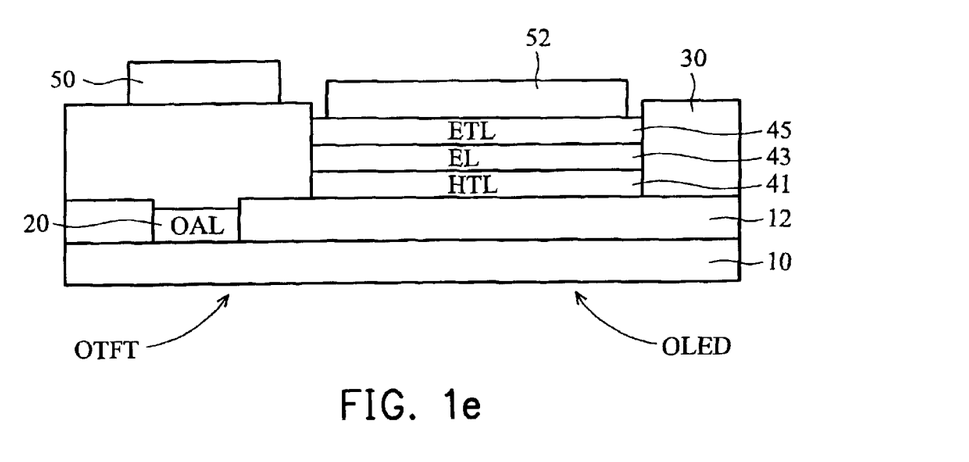

Finally, referring to FIG. 1e, a second conducting layer is formed on the dielectric layer 30 and electron transport layer 45. The second conducting layer is then patterned to form a gate 50 in the OTFT region and a cathode 52 in the OLED region. The gate 50 and cathode 52 can be made of the same material. To meet the requirements of cathode of OLED, material capable of injecting electrons into organic semiconductor is preferable, for example, low work function material such as Ca, Mg, Al or their alloys.

Figure 2A:
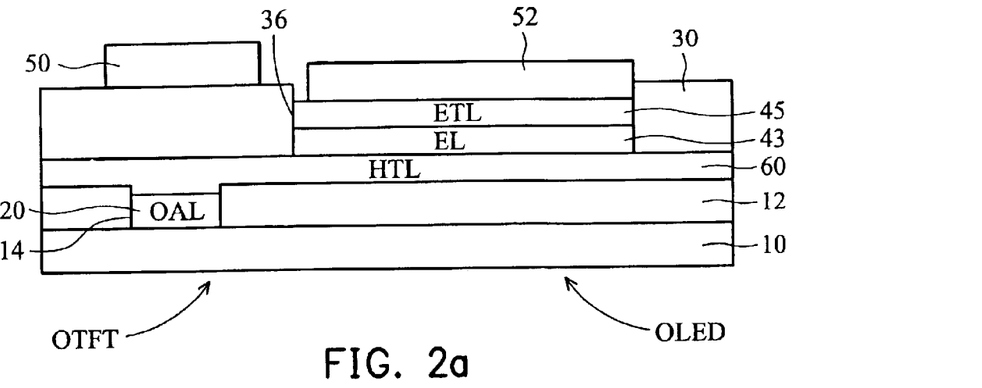
FIGS. 2a to 2c are cross-sections of varied structures based on the organic integrated device for thin film transistor and light emitting diode of FIG. 1e.
Figure 2B:
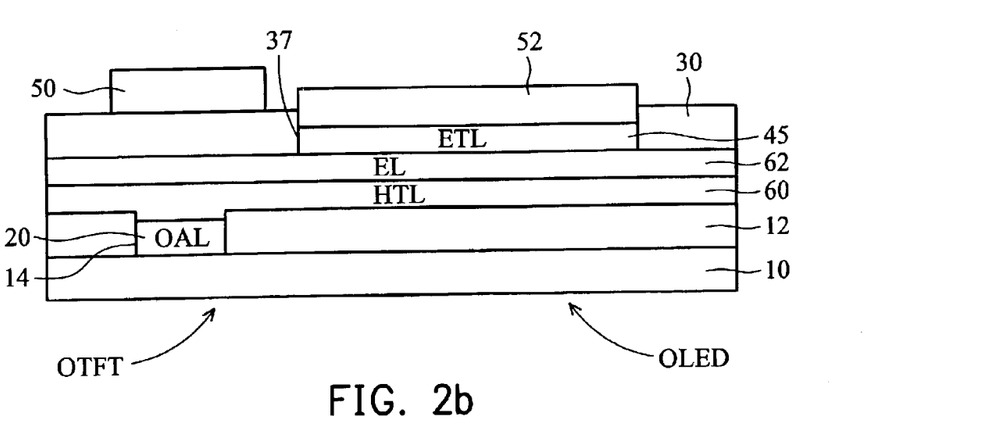
Figure 2C:
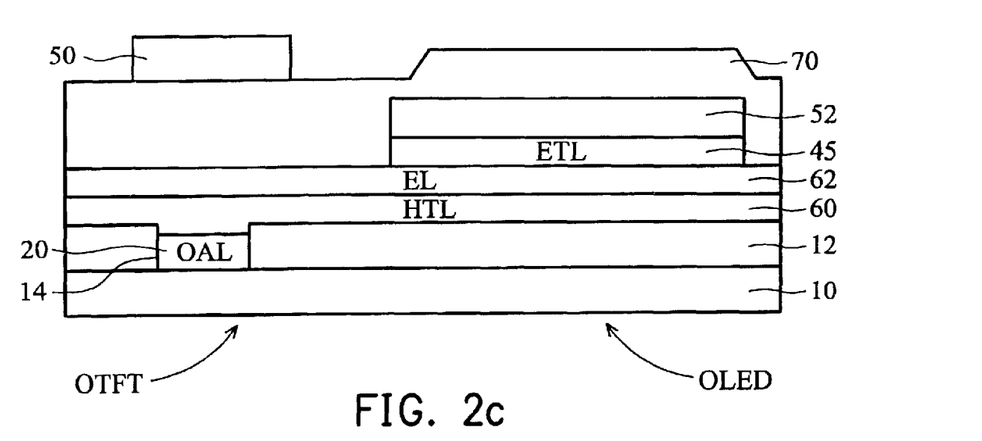

Variations based on the integrated device of FIG. 1e are within the scope of the present invention. FIGS. 2a to 2c are cross-sections of integrated device varied based on the structure of FIG. 1e.

FIG. 2a differs from FIG. 1e in that the hole transport layer (HTL) is formed before the dielectric layer. The process for fabricating the integrated device of FIG. 2a is almost the same as FIG. 1e; therefore, detailed cross-sections illustrating the process flow are omitted. The process is simply described below. After the structure of FIG. 1b is formed, a hole transport layer 60 is formed on the substrate 10, and then a dielectric layer 30 is formed on the hole transport layer 60. Next, a second opening 36 is formed in the dielectric layer 30 in the OLED region. Next, a light emitting layer 43 and an electron transport layer 45 are successively formed to fill in the second opening 36. Finally, a second conducting layer is formed on the dielectric layer 30 and electron transport layer 45, which is then pattered to form a gate 50 in the OTFT region and a cathode 52 in the OLED region.

FIG. 2b differs from FIG. 1e in that the hole transport layer (HTL) and light emitting layer (EL) are first formed before the dielectric layer. The process for fabricating the integrated device of FIG. 2b is almost the same as FIG. 1e; therefore, detailed cross-sections illustrating the process flow are omitted. The process is simply described below. After the structure of FIG. 1b is formed, a hole transport layer 60 and a light emitting layer 62 are formed successively on the substrate 10, and then a dielectric layer 30 is formed on the light emitting layer 62. Next, a second opening 37 is formed in the dielectric layer 30 in the OLED region. Next, an electron transport layer 45 is formed to fill in the second opening 37 in the dielectric layer 30. Finally, a second conducting layer is formed on the dielectric layer 30 and electron transport layer 45, and is then pattered to form a gate 50 in the OTFT region and a cathode 52 in the OLED region.

FIG. 2c differs from FIG. 1e in that after the OLED device is completed, the dielectric layer is formed. The process for fabricating the integrated device of FIG. 2c is almost the same as FIG. 1e; therefore, detailed cross-sections illustrating the process flow are omitted. The process is simply described below. After the structure of FIG. 1b is formed, a hole transport layer 60 and a light emitting layer 62 are successively formed on the substrate 10. Next, an electron transport layer 45 and a cathode 52 are successively formed on the light emitting layer 62 in the OLED region to complete the OLED device. Next, a dielectric layer 70 is formed to cover the light emitting layer 62 and cathode 52. Finally, a gate 50 is formed on the dielectric layer 70 in the OTFT region.

Figure 3A:
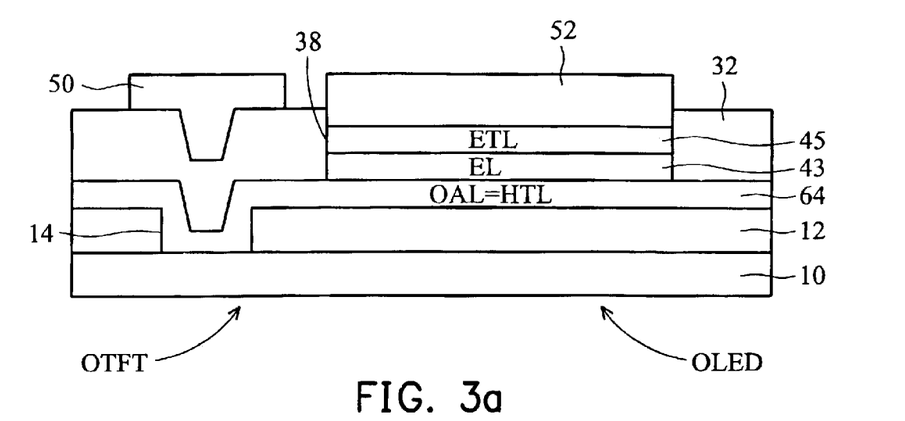
FIGS. 3a to 3c are cross-sections illustrating the process flow of forming an organic integrated device for thin film transistor and light emitting diode according to a second preferred embodiment of the present invention.
Figure 3B:
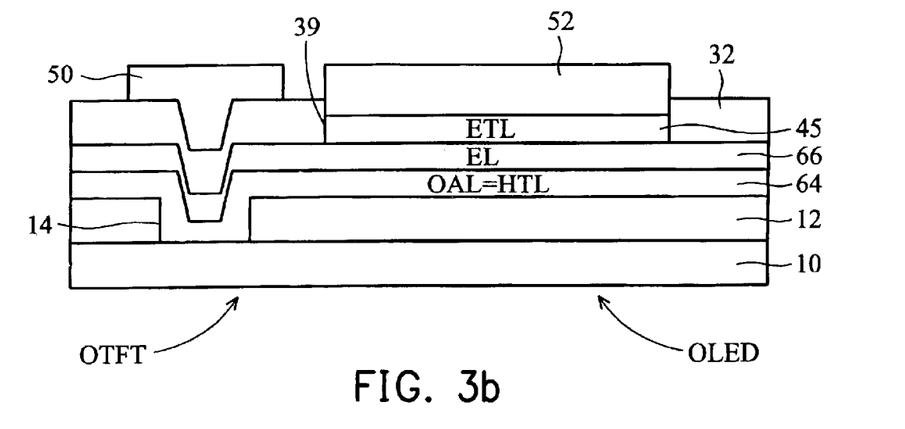
Figure 3C:
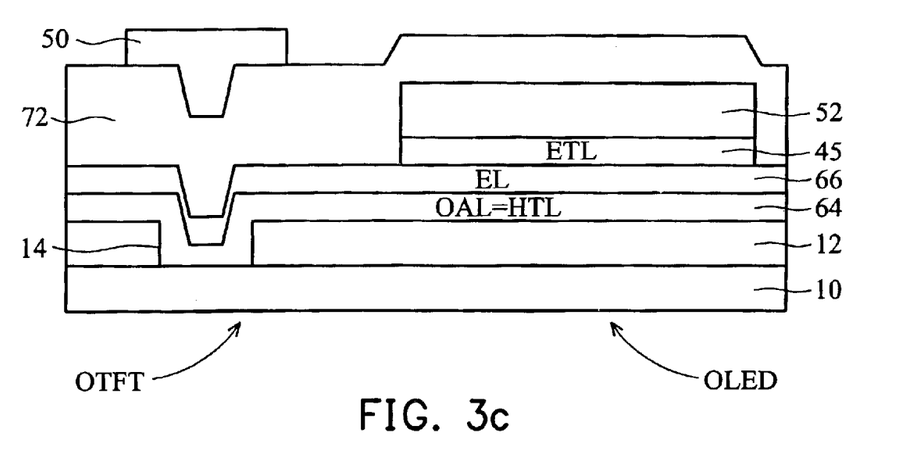

FIGS. 3a to 3c are cross-sections of integrated devices of OTFT and OLED according to a second preferred embodiment of the present invention. The second preferred embodiment (FIGS. 3a to 3c) differs from the first (FIGS. 1e and 2a to 2c) mainly in that the organic active layer (OAL) of OTFT and the hole transport layer (HTL) of OLED are made of the same material and are the same layer.

The processes for fabricating integrated devices of FIGS. 3a to 3c are almost the same as FIG. 1e; therefore, detailed cross-sections illustrating the process flow are omitted. First, referring to FIG. 3a, the process is simply described below. A substrate 10 including an OTFT region and an OLED region is provided. A first conducting layer 12 is formed on the substrate 10 and a first opening 14 is formed in the first conducting layer 12 in the OTFT region to expose the substrate 10. Thus, the first conducting layer 12 constitutes a source and drain of a top-gate OTFT to be formed in the future and an anode of an OLED to be formed in the future. Next, an organic semiconducting layer 64 is formed on the first conducting layer 12 to fill in the first opening 14, serving as an organic active layer (OAL) of top-gate OTFT and a hole transport layer (HTL) of OLED. Next, a dielectric layer 32 is formed on the organic semiconducting layer 64 and a second opening 38 is formed in the dielectric layer 32 in the OLED region. Next, a light emitting layer 43 and an electron transport layer 45 are successively formed to fill in the second opening 38 in the dielectric layer 32. Finally, a second conducting layer is formed on the dielectric layer 32 and electron transport layer 45, which is then patterned to form a gate 50 in the OTFT region and a cathode 52 in the OLED region.

Variations based on the integrated device of FIG. 3a are within the scope of the present invention. FIGS. 3b and 3c are cross-sections of integrated device varied based on the structure of FIG. 3a.

FIG. 3b differs from FIG. 3a in that the light emitting layer (EL) is first formed before the dielectric layer. The process is simply described below. After the OAL (=HTL) commonly used by OTFT and OLED is formed, a light emitting layer 66 is first formed, and then a dielectric layer 32 is formed on the light emitting layer 66. Next, a second opening 39 is formed in the dielectric layer 32 in the OLED region. Next, an electron transport layer 45 is formed to fill in the second opening 39 in the dielectric layer 32. Finally, a second conducting layer is formed on the dielectric layer 32 and electron transport layer 45, and is then patterned to form a gate 50 in the OTFT region and a cathode 52 in the OLED region.

FIG. 3c differs from FIG. 3a in that after the light emitting layer (EL) is formed and after the OLED device is completed, the dielectric layer is formed. The process is simply described below. After the OAL (=HTL) commonly used by OTFT and OLED is formed, a light emitting layer 66 is formed. Next, an electron transport layer 45 and a cathode 52 are successively formed on the light emitting layer 66 in the OLED region, thus completing the OLED. Next, a dielectric layer 72 is formed to cover the light emitting layer 66 and cathode 52. Finally, a gate 50 is formed on the dielectric layer 72 in the OTFT region.

Figure 4A:
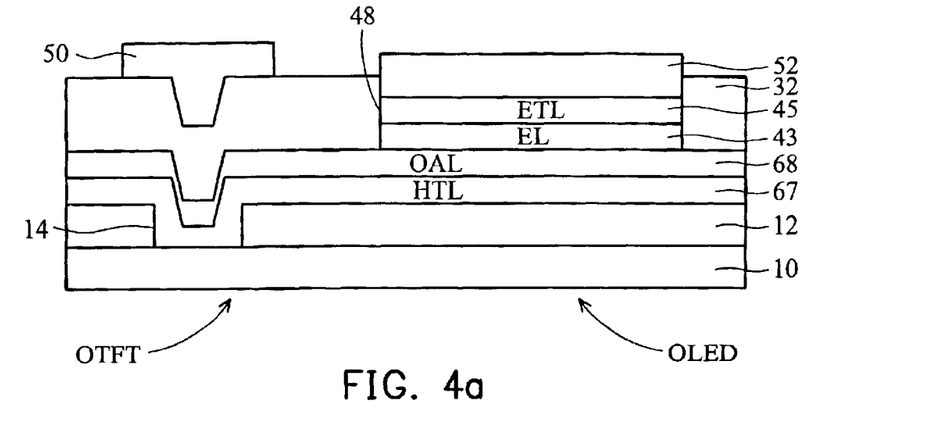
FIGS. 4a to 4c are cross-sections illustrating the process flow of forming an organic integrated device for thin film transistor and light emitting diode according to a third preferred embodiment of the present invention.
Figure 4B:
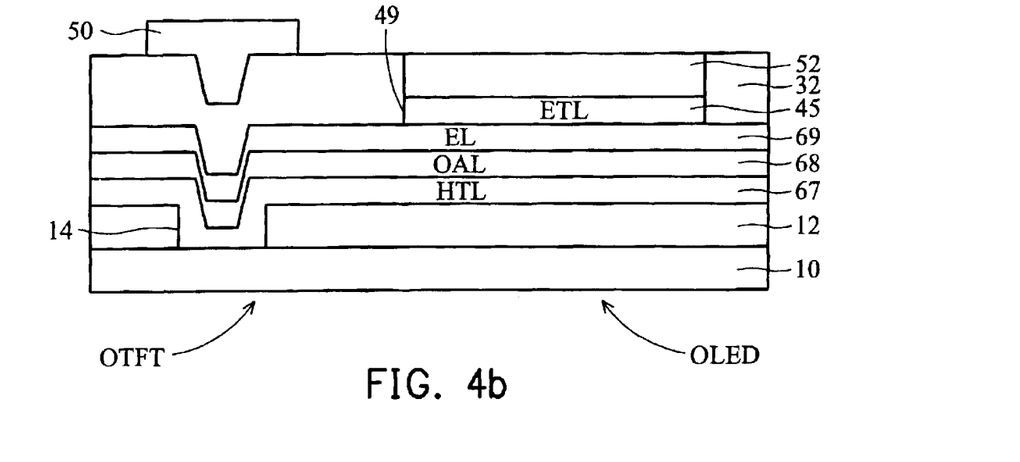
Figure 4C:
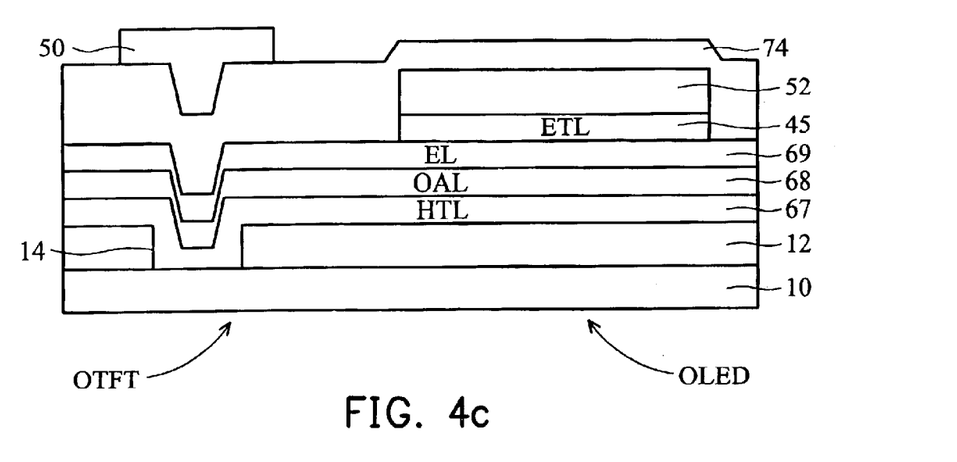

FIGS. 4a to 4c are cross-sections of integrated devices of OTFT and OLED according to a third preferred embodiment of the present invention. The third preferred embodiment (FIGS. 4a to 4c) differs from the first preferred one (FIGS. 1e and 2a to 2c) mainly in that the organic active layer (OAL) of OTFT is chosen to have hole transport or hole blocking function in the OLED. Thus, the OAL can be formed both in OTFT and OLED regions. This not only enhances OTFT electrical properties, but also enhances OLED light emitting efficiency, which is suitable for large area application.

The processes for fabricating integrated devices of FIGS. 4a to 4c are almost the same as FIG. 1e; therefore, detailed cross-sections illustrating the process flow are omitted. First, referring to FIG. 4a, the process is simply described below. A substrate 10 including an OTFT region and an OLED region is provided. A first conducting layer 12 is formed on the substrate 10 and a first opening 14 is formed in the first conducting layer 12 in the OTFT region to expose the substrate 10. Thus, the first conducting layer 12 constitutes a source and drain of a top-gate OTFT to be formed in the future and an anode of an OLED to be formed in the future. Next, a hole transport layer 67 is formed on the first conducting layer 12 both in the OTFT and OLED regions to fill in the first opening 14. Next, an organic semiconducting layer 68 is formed on the hole transport layer 67. Next, a dielectric layer 32 is formed on the organic semiconducting layer 68 and a second opening 48 is formed in the dielectric layer 32 in the OLED region. Next, a light emitting layer 43 and an electron transport layer 45 are successively formed to fill in the second opening 48. Next, a second conducting layer is formed on the dielectric layer 32 and electron transport layer 45, which is then patterned to form a gate 50 in the OTFT region and a cathode 52 in the OLED region.

Variations based on the integrated device of FIG. 4a are within the scope of the present invention. FIGS. 4b and 4c are cross-sections of integrated device varied based on the structure of FIG. 4a.

FIG. 4b differs from FIG. 4a in that the light emitting layer (EL) is first formed before the dielectric layer. The process is simply described below. After the organic active layer (OAL) is formed, a light emitting layer 69 and a dielectric layer 32 are then formed. Next, a second opening 49 is formed in the dielectric layer 32 in the OLED region. An electron transport layer 45 is formed to fill the second opening 49. Next, a second conducting layer is formed on the dielectric layer 32 and electron transport layer 45, which is then patterned to form a gate 50 in the OTFT region and a cathode 52 in the OLED region.

FIG. 4c differs from FIG. 4a in that after the light emitting layer (EL) is formed and the OLED is completed, the dielectric layer is then formed. The process is simply described below. After the organic active layer (OAL) is formed, a light emitting layer 69 is formed. Next, an electron transport layer 45 and a cathode 52 are successively formed on the light emitting layer 69 in the OLED region, thus completing the OLED fabrication. Next, a dielectric layer 74 is formed to cover the light emitting layer 69 and cathode 52. Finally, a gate 50 is formed on the dielectric layer 74 in the OTFT region.

In conclusion, the present invention has the following advantages:

(1) The present invention for the first time integrates a top-gate OTFT and an OLED together on the same substrate. Some layers can be commonly used by OTFT and OLED, and some layers can be made of the same layer and formed in the same course, which simplifies the entire process.

(2) In the OTFT of the present invention, the dielectric layer that is formed on the organic semiconducting layer can serve as a passivation layer. Thus, no additional passivation layer is needed.

(3) Pixel and pixel are separated by the dielectric layer. This effectively decreases current leakage and cross-talk and improves device properties and circuit design.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An organic integrated device for thin film transistor and light emitting diode, comprising:
    a substrate;
    a top-gate organic thin film transistor (OTFT) on the substrate; and
    an organic light emitting diode (OLED) on the substrate, wherein a gate of the OTFT and an anode or cathode of the OLED are of the same material and formed simultaneously.

2. The organic integrated device as claimed in claim 1, wherein the top-gate OTFT drives the OLED.

3. The organic integrated device as claimed in claim 2, wherein the top-gate OTFT includes a gate, a dielectric, a source, a drain, and an organic active layer between the source and drain, wherein the OLED includes an anode, a cathode, and a light emitting layer between the anode and cathode, and wherein the source or drain of the OTFT are the same layer as the anode or cathode of the OLED.

4. The organic integrated device as claimed in claim 2, wherein the top-gate OTFT includes a gate, a dielectric, a source, a drain, and an organic active layer between the source and drain, wherein the OLED includes an anode, a cathode, and a light emitting layer between the anode and cathode, and wherein the gate of the OTFT and the anode or cathode of the OLED are of the same material and formed simultaneously.

5. The organic integrated device as claimed in claim 2, comprising:
    a substrate having an OTFT region and an OLED region;
    a first conducting layer formed on the substrate and having a first opening in the OTFT region to expose the substrate, wherein the first conducting layer constitutes a source and drain of the top-gate OTFT and an anode of the OLED;
    an organic semiconducting layer formed in the first opening and serving as an organic active layer of the top-gate OTFT;
    a hole transport layer formed on the first conducting layer in the OLED region;
    a light emitting layer formed on the hole transport layer;
    an electron transport layer formed on the light emitting layer;
    a dielectric layer formed in the OTFT region to cover the organic semiconducting layer, source, and drain;
    a second conducting layer patterned and divided into a gate on the dielectric layer in the OTFT region and a cathode on the electron transport layer in the OLED region.

6. The organic integrated device as claimed in claim 2, comprising:
    a substrate having an OTFT region and an OLED region;
    a first conducting layer formed on the substrate and having a first opening in the OTFT region to expose the substrate, wherein the first conducting layer constitutes a source and drain of the top-gate OTFT and an anode of the OLED;
    an organic semiconducting layer formed in the first opening and serving as an organic active layer of the top-gate OTFT;
    a hole transport layer formed on the first conducting layer in the OLED region;
    a light emitting layer formed on the hole transport layer;
    an electron transport layer formed on the light emitting layer;
    a cathode formed on the electron transport layer;
    a dielectric layer formed in both the OTFT region and OLED region to cover the source, drain, organic semiconducting layer, and cathode; and
    a gate formed on the dielectric layer in the OTFT region.

7. The organic integrated device as claimed in claim 2, comprising:
    a substrate having an OTFT region and an OLED region;
    a first conducting layer formed on the substrate and having a first opening in the OTFT region to expose the substrate, wherein the first conducting layer constitutes a source and drain of the top-gate OTFT and an anode of the OLED;
    an organic semiconducting layer formed in the first opening and on the anode of OLED, which serves as an organic active layer of the top-gate OTFT and as a hole transport layer of the OLED;
    a light emitting layer formed on the hole transport layer in the OLED region;
    an electron transport layer formed on the light emitting layer;
    a dielectric layer formed in the OTFT region to cover the organic semiconducting layer, source, and drain; and
    a second conducting layer patterned and divided into a gate on the dielectric layer in the OTFT region and a cathode on the electron transport layer in the OLED region.

8. The organic integrated device as claimed in claim 3, comprising:
    a substrate having an OTFT region and an OLED region;
    a first conducting layer formed on the substrate and having a first opening in the OTFT region to expose the substrate, wherein the first conducting layer serves as a source and drain of the top-gate OTFT and an anode of the OLED;
    an organic semiconducting layer formed in the first opening and on the anode in the OLED region, which serves as an organic active layer of the top-gate OTFT and as a hole transport layer of the OLED;

a light emitting layer formed on the hole transport layer in the OLED region;

an electron transport layer formed on the light emitting layer;

a cathode formed on the electron transport layer;

a dielectric layer formed in both the OTFT region and OLED region to cover the source, drain, organic semiconducting layer, and cathode; and a gate formed on the dielectric layer in the OTFT region.

9. The organic integrated device as claimed in claim 2, comprising:

a substrate having an OTFT region and an OLED region;

a first conducting layer formed on the substrate and having a first opening in the OTFT region to expose the substrate, wherein the first conducting layer constitutes a source and drain of the top-gate OTFT and an anode of the OLED;

a hole transport layer formed in the first opening and on the first conducting layer in the OLED region;

an organic semiconducting layer formed on the hole transport layer to serve as an organic active layer of the top-gate OTFT;

a light emitting layer formed on the organic semiconducting layer in the OLED region;

an electron transport layer formed on the light emitting layer;

a dielectric layer formed in the OTFT region to cover the organic semiconducting layer, source and drain; and a second conducting layer patterned and divided into a gate on the dielectric layer in the OTFT region and a cathode on the electron transport layer in the OLED region.

10. The organic integrated device as claimed in claim 3, comprising:

a substrate having an OTFT region and an OLED region;

a first conducting layer formed on the substrate and having a first opening in the OTFT region to expose the substrate, wherein the first conducting layer serves as a source and drain of the top-gate OTFT and an anode of the OLED;

a hole transport layer formed in the first opening and on the first conducting layer in the OLED region;

an organic semiconducting layer formed on the hole transport layer to serve as an organic active layer of the top-gate OTFT;

a light emitting layer formed on the organic semiconducting layer in the OLED region;

an electron transport layer formed on the light emitting layer;

a cathode formed on the electron transport layer;

a dielectric layer formed in both the OTFT region and OLED region to cover the source, drain, organic semiconducting layer, and cathode; and a gate formed on the dielectric layer in the OTFT region.

11. A process for fabricating an organic integrated device for thin film transistor and light emitting diode, comprising the following steps:

(a) providing a substrate including an OTFT region and an OLED region;

(b) forming a first conducting layer on the substrate;

(c) forming a first opening in the first conducting layer in the OTFT region to expose the substrate, such that the first conducting layer constitutes a source and drain of a top-gate OTFT and an anode of an OLED;

(d) forming an organic semiconducting layer to fill in the first opening and serve as an organic active layer of the top-gate OTFT;

(e) forming a dielectric layer in the OTFT region;

(f) forming a hole transport layer, light emitting layer, and electron transport layer, in the OLED region;

(g) forming a second conducting layer on the dielectric layer and electron transport layer; and (h) patterning the second conducting layer to form a gate in the OTFT region and a cathode in the OLED region.

12. The process as claimed in claim 11, wherein steps (e) and (f) further comprise:

forming a dielectric layer on the substrate;

forming a second opening in the dielectric layer in the OLED region; and successively forming a hole transport layer, light emitting layer, and electron transport layer to fill in the second opening.

13. The process as claimed in claim 11, wherein steps (e) and (f) further comprise:

forming a hole transport layer on the substrate;

forming a dielectric layer on the hole transport layer;

forming a second opening in the dielectric layer in the OLED region; and successively forming a light emitting layer and electron transport layer to fill in the second opening.

14. The process as claimed in claim 11, wherein steps (e) and (f) further comprise:

forming a hole transport layer and a light emitting layer on the substrate;

forming a dielectric layer on the light emitting layer;

forming a second opening in the dielectric layer in the OLED region; and forming an electron transport layer to fill in the second opening.

15. The process as claimed in claim 11, wherein the steps (e) and (f) further comprise:

successively forming a hole transport layer and a light emitting layer;

successively forming an electron transport layer and a cathode on the light emitting layer in the OLED region;

forming a dielectric layer to cover the light emitting layer and the cathode; and forming a gate on the dielectric layer in the OTFT region.

16. The integrated device for thin film transistor and light emitting diode as claimed in claim 1, further integrated into an organic integrated device display.

* * * * *